United States Patent [19]

Nakamura et al.

[11] 4,286,211
[45] Aug. 25, 1981

[54] DIRECT CURRENT DETECTING DEVICE USING SATURABLE REACTORS

[75] Inventors: Kiyoshi Nakamura, Ibaraki; Hiroaki Ishikawa, Kawasaki; Hisakatsu Kiwaki; Fumio Ogata, both of Ibaraki, all of Japan

[73] Assignee: Hitachi, Ltd., Tokyo, Japan

[21] Appl. No.: 89,372

[22] Filed: Oct. 30, 1979

[30] Foreign Application Priority Data

Oct. 30, 1978 [JP] Japan .................................. 53-134077
Oct. 30, 1978 [JP] Japan .................................. 53-134078

[51] Int. Cl.³ ......................... G01R 33/00; G01R 1/22
[52] U.S. Cl. ................................. 324/117 R; 324/127; 330/8
[58] Field of Search ............... 324/117 R, 127; 330/8

[56] References Cited

U.S. PATENT DOCUMENTS

| | | | |
|---|---|---|---|
| 2,164,383 | 7/1939 | Burton | 330/8 |
| 3,015,073 | 12/1961 | Mamon | 330/8 |
| 3,801,907 | 4/1974 | Lilienstein | 324/117 R |

OTHER PUBLICATIONS

Fry, M. G. J.; "An Inexpensive . . ."; IEEE Trans. on Nuc. Sci.; vol. NS-18; No. 3; Jun. 1971; pp. 865-868.
"No-Contact DC-Transformer . . ."; Electronic Design; Jun. 7, 1973.
Fuja et al.; "Performance of . . ."; IEEE Trans. on Nuc. Sci.; Jun. 1973; pp. 411-413.

Primary Examiner—Ernest F. Karlsen
Attorney, Agent, or Firm—Craig and Antonelli

[57] ABSTRACT

A direct current detecting device is disclosed in which two pairs of saturable cores are provided so as to enclose a conductor carrying a direct current to be measured. On each of the saturable cores, a bias winding, a feedback winding and an output winding are wound. First and second output circuits are provided, each connected with a pair of output windings and each including two closed current paths consisting of the output winding, a common load, a common A.C. supply source and a diode. The diodes function to allow the greater one of current flows of the two closed paths to be passed through the common load. An amplifier is connected to receive the difference between output signals of the two output circuits. The output of the amplifier is supplied to the feedback winding whereby the magnitude of the feedback current becomes a function of the magnitude of the current flowing through the conductor.

15 Claims, 10 Drawing Figures

*FIG. 8*
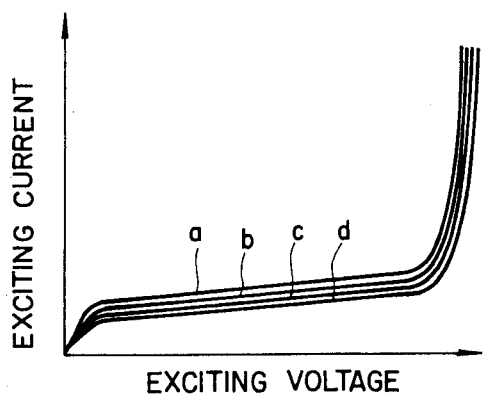
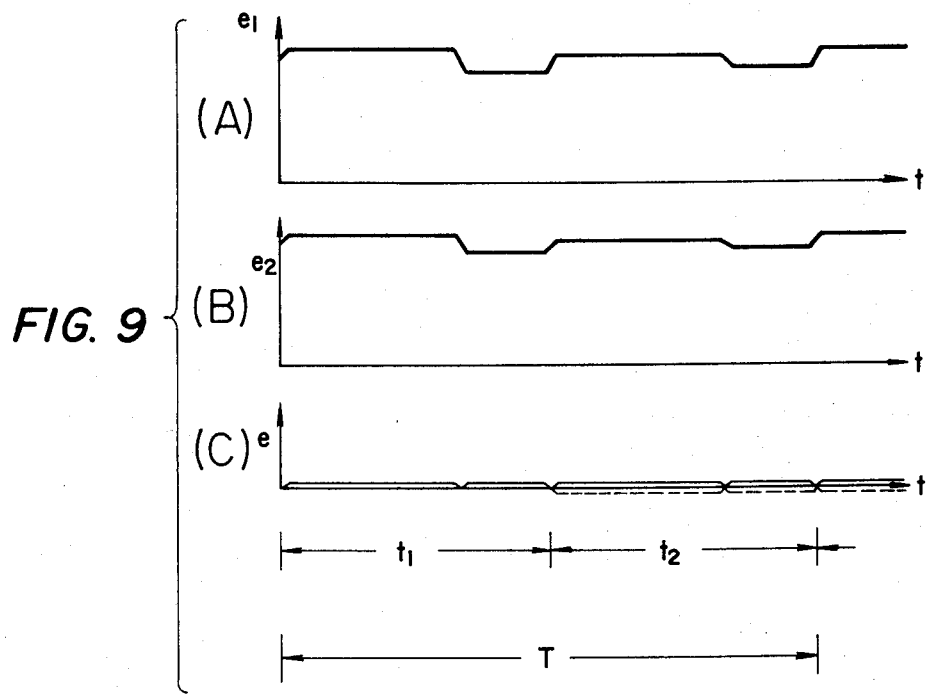
*FIG. 9*

DIRECT CURRENT DETECTING DEVICE USING SATURABLE REACTORS

BACKGROUND OF THE INVENTION

The present invention relates to a direct current detecting device using a plurality of saturable reactors, and, more particularly, to a device for measuring a direct current flow of a bus or a conductor with a high precision by utilizing saturable reactors.

The device of the present invention is suitable for use in the detection and measurement of an exciting current of a superconductive magnet or a nuclear particle accelerator. In these applications, it is desirable to detect or measure the d.c. current flow of a conductor with high precision while maintaining electrical insulation between the detector and the conductor.

Proceeding of IV International Symposium on Magnet Technology, September, 1972, page 865 to page 868 describes the so called Kraemer type d.c. current transformer utilizing a pair of saturable reactors which is one type of conventional d.c current detecting devices. The Kraemer d.c current transformer, however, suffers from a relatively low measurement precision for several reasons. One of the reasons is that an output of the Kraemer d.c current transformer includes a high ripple voltage level because slits or notches are inevitably present in its waveform at each cycle. Another is due to an unbalance of characteristics of exciting current versus exciting voltage of the saturable reactor pair.

In order to eliminate the latter problem, the use of two saturable reactor pairs has been proposed as described in U.S. Pat. No. 3,801,907 as well as in Electronic Design, June 7, 1973. This patent discloses a device for the measurement of the direct current, in which a pair of Kraemer d.c. current transformers are utilized to produce a differential output which is supplied to a feedback winding on each reactor. The device, however, still suffers from a high ripple voltage level due to the waveform slits or notches. In other words, the device has difficulty in eliminating the former problem mentioned above. It is, of course, possible to reduce the undesirable influence of the ripple by lowering the gain and frequency response of a differential amplifier. However, this results in also lowering the precision of the measurement of the current flow.

Another way of reducing the ripple level of the output voltage waveform is to utilize another saturable reactor connected in series with the output circuit of the differential amplifier as suggested in the above U.S. Pat. No. 3,801,907. However, the addition of the saturable reactor for suppressing the ripple voltage level causes a lowering of the frequency response with respect to the current flow changes to be measured. In consequence, it seems that according to the conventional device, there is no effective way of suppressing the slits or notches of the output waveform without lowering both the measurement precision and the frequency response characteristic.

On the other hand, the aforementioned paper, Proceeding of the IV International Symposium on Magnet Technology, September 1972 PP865-868 describes an improved d.c. current transformer capable of eliminating the slits or notches of the output waveform. This device, however, has a disadvantage in that an undesirable exciting current of the magnetic core is superposed on the output current so that the measurement precision is lowered.

SUMMARY OF THE INVENTION

It is, therefore, an object of the present invention to provide a high precision, no-contact d.c. current detecting device.

More specifically stated, an object of the present invention resides in providing a d.c. current detecting device which is capable of eliminating not only the slits or notches of the output waveform but also the undesired influence of the exciting current of the saturable magnetic core, while still providing high precision and a high frequency response.

One of the features of the present invention is to utilize two pairs of saturable reactors with each pair producing a no-slit output current proportional in value to a current flow to be measured. The output circuits of the two pairs of saturable reactors are connected to produce a differential output so that the exciting current flows can be remarkably reduced.

Another feature of the present invention resides in that the output circuit connected with a pair of saturable reactors includes two closed current paths each including a common A.C. voltage source, a common load and an individual diode. The diode is connected so that the greater one of the two current flows of the closed paths can be selected to pass through the load.

Still another feature of the present invention resides in selecting the A.C. voltage source to have a voltage equal to or greater than 1.25 times the voltage drop of each of the closed current paths. This selection contributes to operate each saturable reactor in such a way that the unsaturation period of time becomes longer than the saturation period of time in each cycle of the A.C. voltage.

Yet another feature of the present invention resides in that the output currents of the two output circuits pass through a common impedance element in a direction opposite to each other, thereby obtaining a differential current which is unaffected by changes in value of the loads resulting from temperature changes.

The other objects, advantages and features of the present invention will become more apparent from the following detailed description when read in conjunction with the accompanying drawings.

BRIEF DESCRIPTION OF THE DRAWINGS

FIG. 8 shows curves of exciting current versus exciting voltage characteristics of the saturable cores;

FIG. 9a–9c show waveforms of the output voltages of the output circuit; and

DETAILED DESCRIPTION OF THE PREFERRED EMBODIMENTS

Figure 1:
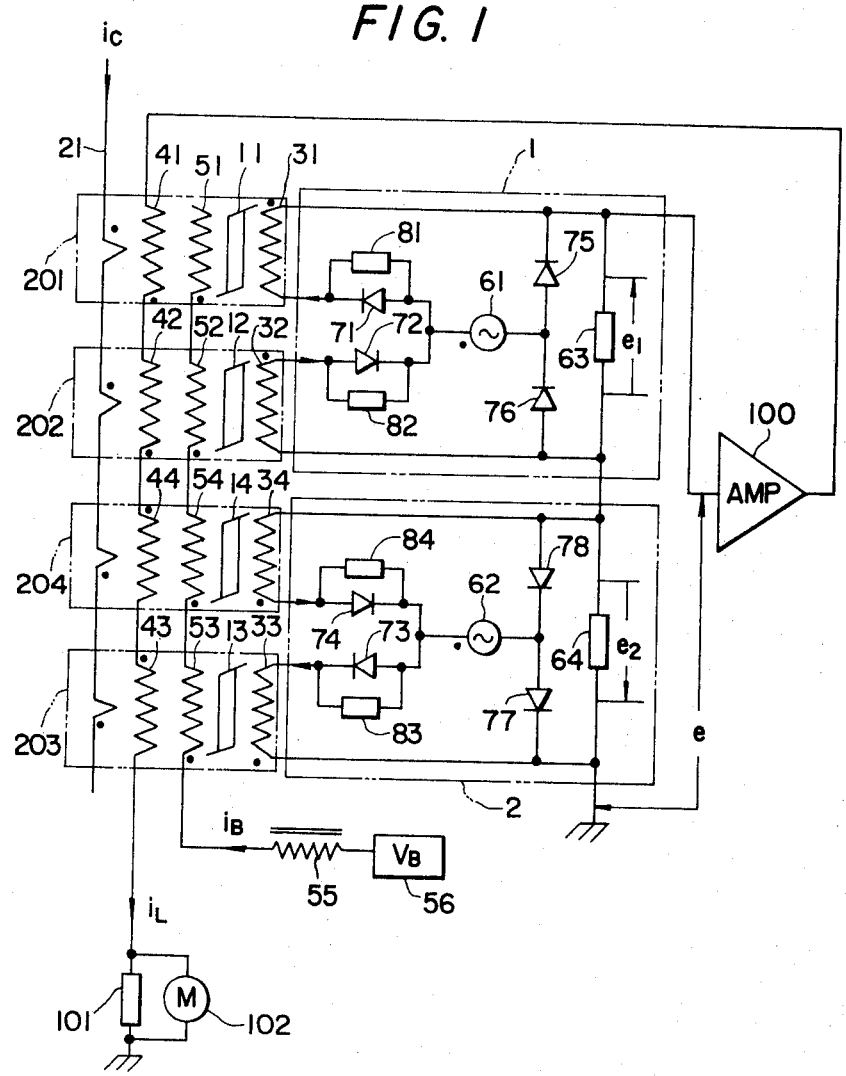
FIG. 1 is a circuit diagram of a d.c. current detecting device according to an embodiment of the present invention.

Referring now to FIG. 1, the device for the d.c. current measurement of the present invention comprises two pairs of saturable reactors 201, 202 and 203, 204, a pair of output circuits 1, 2 each connected with the saturable reactor pair, and a differential amplifier 100 with its input connected to the two output circuits 1, 2 to receive a differential signal and its output connected to windings of the saturable reactors.

The saturable reactor 201 is comprised of a saturable toroidal core 11 enclosing a conductor 21 which carries a current flow $i_c$ to be measured. The core 11 has an output winding 31, a feedback winding 41 and a bias winding 51 wound thereon. The second saturable reactor 202 is made up of a saturable toroidal core 12 disposed to enclose the conductor 21, an output winding 32, a feedback winding 42 and a bias winding 52 wound on the core 12. The third saturable reactor 203 comprises a saturable toroidal core 13 enclosing the conductor 21, an output winding 33, a feedback winding 43 and a bias winding 53 wound on the core 13. Likewise, the fourth saturable reactor 204 is made up of a saturable toroidal core 14 enclosing the conductor 21, an output winding 34, a feedback winding 44 and a bias winding 54 wound on the core 14. It should be noted that the conductor 21 includes at least a one-turn winding in the area where it passes through each of the saturable reactors, as shown in FIG. 1. Respective feedback windings 41, 42, 43 and 44 are connected in series with each other. An output resistor 101 is connected to the feedback winding 43. An indicator 102 is connected to measure the voltage developed across the output resistor 101 due to a feedback current $i_L$. The bias windings 51, 52, 53 and 54 are connected in series with each other and these windings are supplied with a bias current $i_B$ from a bias source 56 through a choke coil 55. The choke coil 55 serves to prevent a current flow due to an induced voltage across the bias windings 51, 52, 53, 54 through the magnetic coupling with the output windings 31, 32, 33, 34 respectively. A dot mark (.) beside each winding indicates the direction in which the winding is wound. More specifically stated, when the current flows $i_c$, $i_L$ and $i_B$ pass in the direction as indicated at arrows respectively, certain magnetic relationships are present. Namely, in the first pair of magnetic cores 11, 12, magnetic flux due to the bias current $i_B$ is produced in the same direction as magnetic flux due to the input current $i_c$ while magnetic flux due to the feedback current $i_L$ is formed in the opposite direction thereto. On the other hand, in the second pair of cores 203, 204, the magnetic flux due to both the feedback current $i_L$ and the bias current $i_B$ is produced in the direction opposite to the magnetic flux due to the input current $i_c$. It is noted that in the first pair of cores 11, 12, the magnetic fluxes due to the current flows passing through the output windings 31, 32 are produced in the same direction. The same can be applied to the second pair of cores 13, 14.

First output circuit 1 is connected with the output windings 31, 32 of the first saturable pair while the second output circuit 2 is connected with the output windings 33, 34 of the second saturable pair. Since both the output circuits are the same in configuration, only the first output circuit 1 will be described hereinafter for simplicity of the explanation. The first output circuit 1 includes an A.C. voltage source 61, diodes 71, 72, 75, 76, resistors 81, 82 and a load 63. Across the load 63, the diodes 75 and 76 are connected in series. The diodes 71 and 72 are connected between the A.C. voltage source 61 and output windings 31, 32, respectively, to permit a current flow to be passed in the direction indicated at arrows. The resistors 81, 82 are connected across the diodes 71, 72 respectively for limiting current flows in the direction opposite to the indicated arrows.

It should be noted that there are two closed current paths in the first output circuit 1. One closed current path comprises the A.C. voltage source 61, the diode 71, the output winding 31, the load 63 and the diode 76. The other path includes the A.C. voltage source 61, the diode 75, the load 63, the output winding 32 and the diode 71. The diodes 75 and 76 serve to allow the greater one of current flows of the two closed paths to pass through the load 63. In other words, the diode pair 75, 76 functions to select one of the closed path current flows greater in value than the other so that the selected current can flow through the load 63 as a load current. Due to the load current, a voltage $e_1$ is developed across the load 63 in the direction indicated by an arrow.

On the other hand, the second output circuit 2 produces a voltage $e_2$ across the load 64 in the direction opposite to the voltage $e_1$ as indicated by an arrow by utilizing the same basic circuit arrangement as the first output circuit 1 but with the diodes 73, 74, 77 and 78 connected with an opposite polarity from diodes 72, 71, 76 and 78, respectively, of the first output circuit.

The differential voltage ($e_1-e_2$) is applied to the amplifier 100 which produces an output current proportional in value to the input differential voltage. The output current is fed back to the windings 41, 42, 43 and 44 of the saturable reactors thereby balancing the voltage $e_1$ with $e_2$. The feedback current $i_L$ flows through the output resistor 101 and the voltage developed across the resistor 101 is measured by means of the indicator In order to eliminate slits or notches of the output current waveform, it is desirable to select the voltage $v$ of the A.C. sources 61, 62 as follows:

$$v \geq 1.25\, v_c \qquad (1)$$

where $v_c$ indicates a voltage drop in each closed current path of the output circuits 1 and 2.

This selection of voltage $v$ causes to each of the saturable reactors 201, 202, 203 and 204 to be operated in such a manner that the unsaturation period of time of the reactors is greater than the saturation period of time for each cycle of the A.C. voltage $v$, as described later in detail.

The operation of the device will now be explained. For a better understanding of the present invention, the operation of the parts of the device will first be described with reference to FIG. 2 in which like numerals to FIG. 1 denote like elements.

Figure 2:
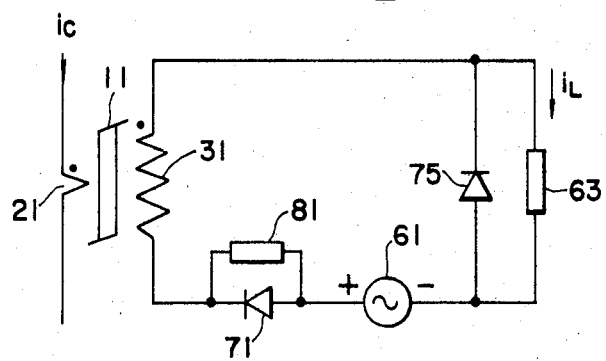
FIG. 2 shows a portion of an output circuit of the present invention.
Figure 3:
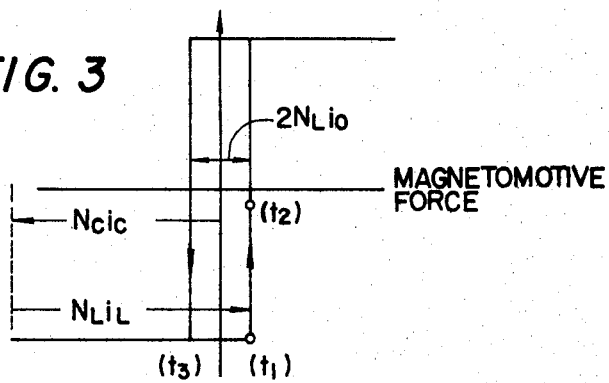
FIG. 3 shows a magnetic flux versus magnetomotive force characteristic of a saturable core.

In this circuit, the saturable core 11 is assumed to have magnetic flux versus magnetomotive force characteristic as shown in FIG. 3. When the A.C. voltage source 61 has a polarity as shown in FIG. 2, a current flows through the closed path consisting of the diode 71, the output winding 31, the load resistor 63 and the A.C. voltage source 61. In a case where the voltage across the output winding 31 is positive, that is, the A.C. source voltage minus the voltage drop across the load is positive, the magnetic flux of the core 11 begins to increase from the point $t_1$ of the negative saturation on the characteristic curve as shown in FIG. 3. Until the polarity of the applied voltage of the output winding 31 changes at point $t_2$, a current $i_L$ flows on the basis of the law of equal ampare-turns as given by the following expression.

$$i_L = \frac{N_c}{N_L} i_c + i_o \quad (2)$$

where $N_L$ denotes the number of turns of the output winding 31, $N_c$ the number of turns of the input conductor 21, and $i_o$ the exciting current of the core 11. Usually the conductor 21 is formed to penetrate all the saturable cores, therefore $N_c$ may be assumed to be one turn. When the polarity of the applied voltage of the output winding has changed at the point $t_2$ (that is when the A.C. source source voltage minus the voltage drop across the load is negative), the magnetic flux passing through the core 11 begins to decrease, and a current given by the following equation flows in the closed path:

$$i_L = \frac{N_c}{N_L} i_c - i_o \quad (3)$$

When the core has been saturated at the point $t_3$, a current which is determined by the A.C. supply voltage and the current limiting resistor 81 flows through the closed path consisting of the diode 75, the output winding 31, the resistor 81 and the A.C. supply source 61 because the polarity of the A.C. supply voltage is opposite to the one indicated in FIG. 2 at this time. Since this current flow is not effective for the purpose of the measurement of the input current, it is by-passed by the diode 75 so as to be prevented from flowing through the load 63. As a result, the current as shown at $i_L$ in FIG. 4 flows through the load 63.

Figure 4:
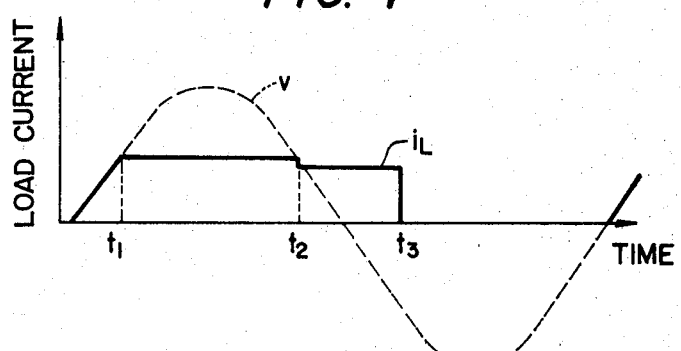
FIG. 4 shows a waveform of a load current of FIG. 2.

It can be seen from FIG. 4 that the use of only one current transformer as shown in FIG. 2 is not sufficient to obtain an output current extending over one cycle of the A.C. supply voltage $v$. According to the present invention, therefore, each of the d.c. current transformers is constructed by connecting two current transformers of FIG. 2 in parallel such that a single A.C. supply source and a single load are utilized in common.

Figure 5:
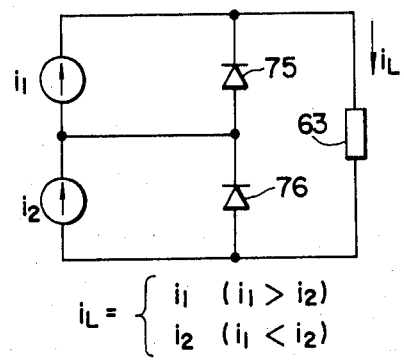
FIG. 5 shows an equivalent circuit of the output circuit of the invention.

The d.c. current transformer used in the present invention is shown as an equivalent circuit in FIG. 5. In this figure, current sources $i_1$ and $i_2$ produce output currents which are shifted in phase from each other by half a cycle of the A.C. supply voltage $v$ as shown at $i_1$, $i_2$ in FIG. 6. As mentioned before, the diodes 75 and 76 are connected to allow the greater one of two current flows $i_1$ and $i_2$ to be selectively passed through the load 63. Accordingly, when the current flow $i_1$ is greater than $i_2$, then the load current $i_L$ becomes equal to $i_1$ and the difference between the currents $i_1$ and $i_2$ flows through the diode 76. In contrast, when the current flow $i_2$ is greater than $i_1$, then the load current $i_L$ becomes equal to $i_2$ and the difference between the currents $i_2$ and $i_1$ flows through the diode 75.

Figure 6:
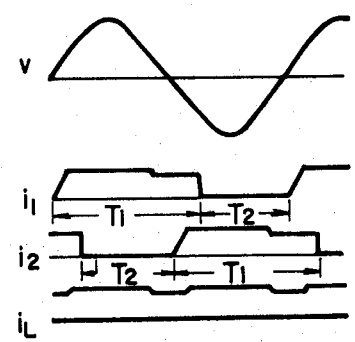
FIG. 6 shows waveforms of signals at respective portions of FIG. 5.

In order to eliminate all substantial slits or notches in the waveform of the load current $i_L$, it is necessary that the period of time $T_1$ is greater than the period of time $T_2$ in FIG. 6. In other words, the time period for which the core is in unsaturation state is required to be greater than the time period for which the core is in saturation state within one cycle of the A.C. supply voltage. In accordance with the inventor's experiments, it was found that to achieve the above requirement, the A.C. supply voltage is desired to be equal to or greater than 1.25 times the voltage drop developed through each of the closed current paths, consisting of, for instance, the A.C. voltage source 61, the diode 71, the output winding 31, the load 63 and the diode 76. Therefore, as will be understood from the above discussion, each of the output voltages $e_1$ and $e_2$ contains no substantial slits nor notches in their waveforms.

A description will now be made of the operation of the whole arrangement of the embodiment shown in FIG. 1 with reference to FIG. 7.

Figure 7:
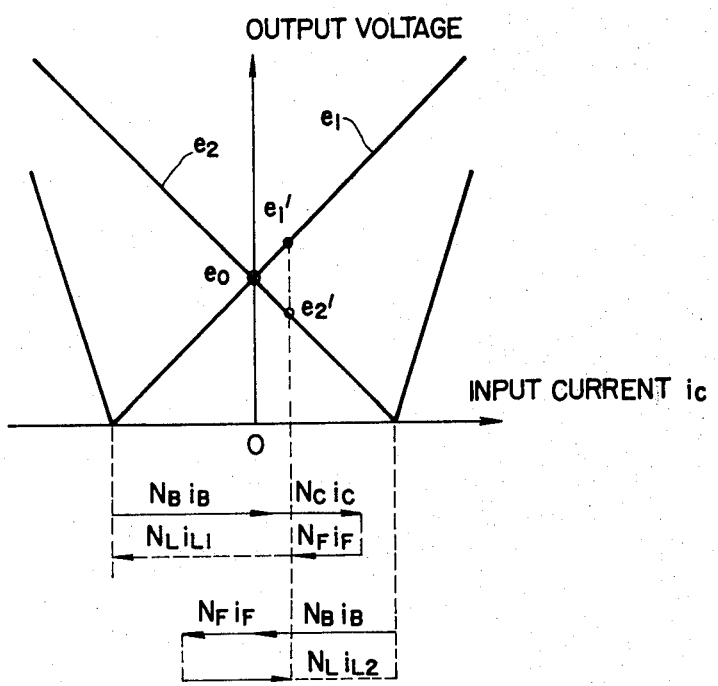
FIG. 7 shows an output voltage versus input current characteristic of the embodiment of FIG. 1.

When the input current $i_c$ is zero, both the output voltages $e_1$ and $e_2$ of the first and second output circuits 1 and 2 are equal to a voltage $e_O$ indicated in FIG. 7. The voltage $e_0$ corresponds to a bias magnetomotive force $N_B i_B$ which is determined by the number $N_B$ of turns of the bias winding and the bias current $i_B$. Since a deviation voltage e between the output voltages $e_1$ and $e_2$ is zero, and d.c. amplifier 100 delivers zero output current. As a result, zero terminal voltage is developed across the precision resistor 101.

When the input current $i_c$ flows through the conductor 21, the output voltage $e_1$ of the first output circuit increases as shown at $e_1'$ while the output voltage $e_2$ of the second output circuit decreases as shown at $e_2'$, thereby producing the difference voltage e. The d.c. amplifier 100 receives the difference voltage e and supplies a feedback current $i_F$ to the feedback windings 41, 42, 43 and 44. Each of the feedback windings 41, 42, 43 and 44 has the number $N_F$ of turns so that the current $i_F$ develops the magnetomotive force in the amount of $N_F i_F$ in the direction opposite to $N_c i_c$. Until the magnetomotive force $N_F i_F$ reaches the magnetomotive force $N_c i_c$, the amplifier 100 continues to increase the output current $i_F$ supplied to the feedback windings. Finally, the magnetomotive force $N_F i_F$ counterbalances the magnetomotive force $N_c i_c$ so that the voltage $e_1$ becomes substantially equal to the voltage $e_2$. If the amplification degree and the frequency response of the d.c. amplifier 100 are sufficiently high, the deviation between $e_1$ and $e_2$ becomes nearly zero. Accordingly, the feedback current $i_F$ can be expressed as follows.

$$i_F = \frac{N_c}{N_F} i_c \quad (4)$$

As apparent from the equation (4), the current $i_F$ is simply proportional to the input current $i_c$, and the precision detection of the current $i_c$ can be realized by measuring the voltage across the resistor 101.

According to the embodiment of the present invention, the output voltage e does not include slits or notches in its waveform so that an amplifier 100 having a high amplification degree and a high frequency response can be utilized. This, of course, contributes to enhance the measurement precision of the input current $i_c$. On the contrary, if the output voltage e contains slits or notches in its waveform, the d.c. amplifier 100 will operate in response to the slits or notches, with the result that the feedback current $i_F$ has a high ripple voltage level. Due to this ripple voltage, the output voltages $e_1$ and $e_2$ of the first and second output circuits 1 and 2 change greatly and are again amplified by the d.c. amplifier 100 so as to further enhance the ripple voltage level. In order to suppress the ripple voltage level, it is necessary to use a d.c. amplifier having a low amplification degree and a low frequency response characteristic, thereby lowering the precision of the current measurement.

In addition, in the embodiment of the present invention shown in FIG. 1, the first and second output circuits 1 and 2 produce the two output voltages $e_1$ and $e_2$ with a polarity opposite to each other so that the exciting current components included in each output are canceled. The reduction of the exciting current components contributes, of course, to realize a high precision current detection.

The inventors experiments have shown that the device of the embodiment according to the present invention has a remarkably improved performance in comparison to the conventional device described in the aforementioned U.S. patent as shown in the following table:

|  | Device of the Invention | Conventional device |
|---|---|---|
| Linearity | 0.0014% | ±0.015% |
| Offset | 0.0028% | 0.01% |
| Output ripple |  |  |
| Effective value | 0.016% | 0.05% |
| Spike | 0.06% | 0.2% |
| Temperature coefficient | 1 ppm/°C. | 1.25 ppm/°C. |
| Drift | 3 ppm | 25 ppm |
| Frequency response | about 40 kHz | 1 kHz |

Normally, the saturable cores used for the reactors have different exciting current characteristics as shown in FIG. 8. In this figure, the abscissa indicates an exciting voltage of the core and the ordinate represents an exciting current. In order to effectively cancel the exciting current components of the outputs $e_1$ and $e_2$, an appropriate selection of the cores for the saturable reactors is very important. In FIGS. 9a–9c showing waveforms of the output voltages $e$, $e_2$ and the difference voltage $e$, a symbol $t_1$ denotes the period of time for which the cores 11 and 13 operate in the unsaturated state so as to provide the load currents $i_{L1}$ and $i_{L2}$, while a symbol $t_2$ denotes the period of time for which the cores 12 and 14 are in the unsaturated state so as to supply the load currents $i_{L1}$ and $i_{L2}$. The period T corresponds to one cycle of the A.C. supply voltage. In order to effectively cancel the exciting current components, it is desirable that a pair of cores unsaturated in the same time period be selected to have exciting current characteristics which are as similar as possible. From this point of view, according to the embodiment of the present invention, saturable cores having characteristics shown at (a) and (b) in FIG. 8 are utilized for the cores 11 and 13 respectively, while saturable cores shown at (c) and (d) are used for the cores 12 and 14 respectively. Since the difference between the characteristics (a) and (b) as well as the difference between (c) and (d) is quite small in comparison to other combinations of characteristics for the core pair, the exciting current components are remarkably reduced, thereby decreasing a ripple level of the output voltage $e$ as shown by a solid line in FIG. 9(c).

Although the selection of saturable cores mentioned above is aimed at reducing the output ripple voltage level, it is often required to reduce an average value of the ripple voltage during one cycle of the A.C. supply voltage, rather than the ripple voltage level. To achieve this requirement, according to another embodiment of the present invention, a core having the characteristic (c) in FIG. 8 is used for the saturable core 14 and a core having the characteristic (d) is used for the saturable core 12. Of course, cores having the exciting current characteristics (a) and (b) are respectively employed for the saturable cores 11 and 13. In this case, the difference voltage $e$ will become negative during the time period $t_2$ as indicated by a dotted line in FIG. 9(c). Therefore, the average value of the difference voltage $e$ for one cycle of the A.C. supply voltage can be remarkably reduced. In a case where cores having the characteristics (a) and (b) are respectively used as the saturable cores 13 and 11, and the cores having the characteristics (c) and (d) are respectively used as the saturable cores 12 and 14, the same effect as mentioned above can be accomplished.

A description will now be made of still another embodiment of the present invention, referring to FIG. 10 in which like numerals to those in FIG. 1 denote like elements. This embodiment is aimed at further improving the measurement precision by eliminating adverse influences due to unbalanced values of the loads 63, 64. In the circuit configuration of FIG. 1, the output current $i_{L1}$ and $i_{L2}$ are allowed to flow through the loads 63, and 64 to develop the voltage drops $e_1$ and $e_2$ thereacross. Then the difference $e$ between the two voltage drops $e_1$ and $e_2$ is produced for the input to the amplifier 100. Since the loads 63 and 64 usually have different temperature coefficients, the resistances of the loads 63 and 64 change differently so that an unbalance of resistances will almost inevitably be caused. Because of this unbalance, even if the output currents $i_{L1}$ and $i_{L2}$ are equal to each other, the two voltage drops $e_1$ and $e_2$ will not be the same in value, thereby lowering the precision of the detection.

Figure 10:
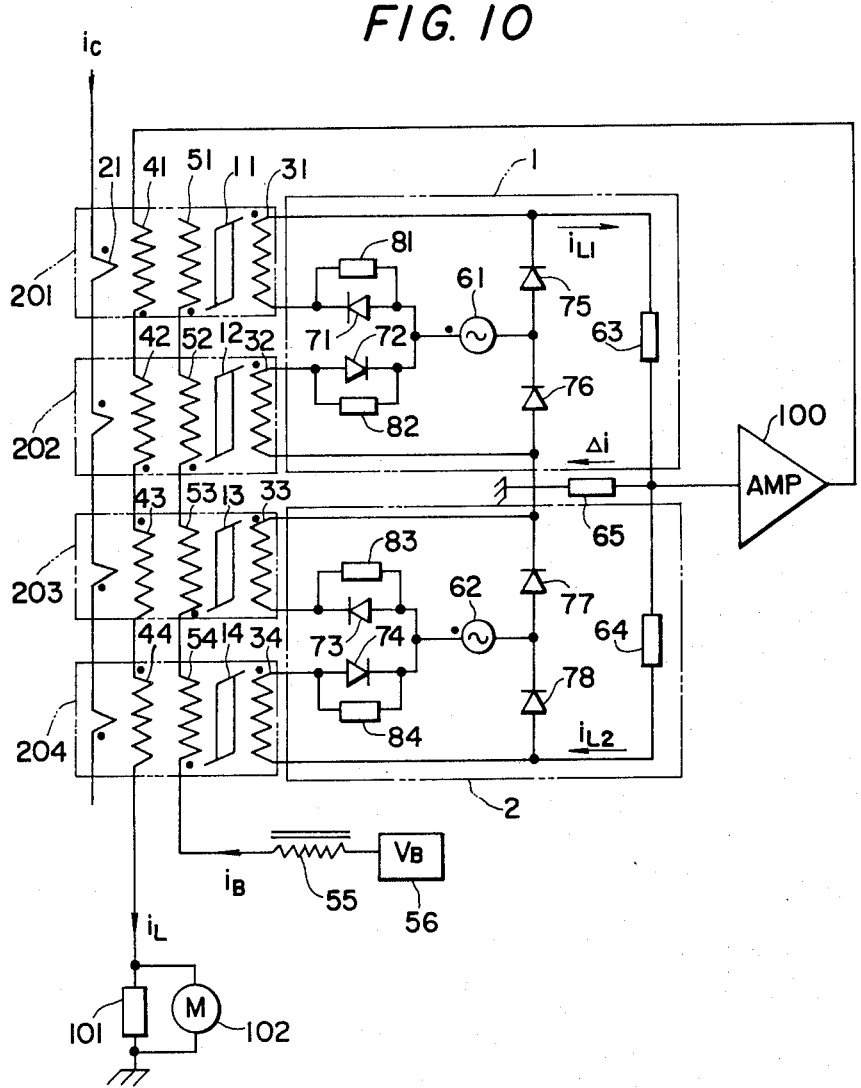
FIG. 10 is a circuit diagram of a d.c. current detecting device according to another embodiment of the present invention.

In order to eliminate this disadvantage the embodiment of FIG. 10 is constructed such that an impedance element 65 is connected at its one terminal to the conjunction point between the two loads 63 and 64 and at the other terminal to ground. By this connection, the output currents $i_{L1}$ and $i_{L2}$ flow through the impedance element 65 in the direction opposite to each other. The difference current $\Delta i$ between $i_{L1}$ and $i_{L2}$ is amplified by the amplifier 100 which supplies the feedback current so as to counterbalance the input current $i_c$. In this manner, the difference current $\Delta i$ is controlled to become zero.

According to the device of this embodiment, since the output currents $i_{L1}$, $i_{L2}$ are not replaced by the voltage $e_1$, $e_2$ corresponding thereto across the loads to obtain the difference therebetween, the difference signal ($\Delta i$) is not affected by the changes in the resistances of the loads 63, 64 due to, for instance, the temperature changes. This manner of obtaining the difference signal is, therefore, effective for further improving the measurement precision.

Although specific embodiments of the invention have been described, it will be apparent by those skilled in this art that certain changes may be made without departing from the scope of the invention. By way of example, although all the windings of the saturable reactors have been described as being wound on each of the cores, the way of forming the windings may be made such that the bias windings 51 and 52 are wound on the cores 11 and 12 in common as one set, the bias windings 53 and 54 are wound on the cores in common as one set, and feedback windings 41, 42, 43 and 44 are wound on the cores 11, 12, 13 and 14 in common as one set, in consideration of their polarities with respect to the input conductor 21. Ordinarily, in order to reduce the number of stages of winding coils, it is desirable to wind the coils of the same polarities of once after stacking the cores.

A further example of such a variation is that while the impedance element 65 is inserted in FIG. 10 to provide a high precision current detector, an input impedance of the amplifier 100 itself could be used for the element 65 if desired. Also, although diodes 75 to 78 have been shown as the means for selecting the larger current between $i_1$ and $i_2$, alternative switching arrangements could be utilized.

We claim:

1. A device for detecting a d.c. current flowing through a conductor, comprising:
   a first and second pair of saturable cores each enclosing said conductor;
   a first and a second plurality of output windings wound on said first and second pair of saturable cores respectively;
   a feedback winding wound on each of said saturable cores;
   first and second output circuits connected with said first and second plurality of output windings, respectively, each output circuit comprising a first closed current path including an A.C. voltage source, one of said plurality of output windings, and a load and a second closed current path including said A.C. voltage source, the other one of said plurality of output windings, and said load, said first and second closed current paths including selection means for selecting the greater one of two current flows of said two closed current paths to be supplied to said load; and
   an amplifier having an input connected to said first and second output circuits to receive a difference between the output signals of the first and second output circuits and an output connected with said feedback windings to supply an output current of the amplifier to said feedback windings, whereby the magnitude of the feedback current is a function of the magnitude of the d.c. current flowing through the conductor.

2. A device as defined in claim 1 or, wherein the voltage of said A.C. voltage source is selected to be equal to or greater than 1.25 times a voltage drop in each of the closed current paths.

3. A device as defined in claim 1, which further comprises an impedance means connected to both the first and second input circuits such that the output current flows of the first and second output circuits pass through the impedance means in the direction opposite to each other to produce a difference signal and means for applying the difference signal to said amplifier as its input.

4. A device as defined in claim 1, wherein each feedback winding is wound on each of the saturable cores in magnetic opposition to the winding of the conductor carrying the current to be detected which is adjacent said saturable core.

5. A device as defined in claim 1, which further comprises a bias winding on each of the saturable cores in such a way that the magnetic flux due to a bias current of the bias winding is formed in the second plurality of saturable cores in the same direction as the magnetic flux due to the feedback current flow while it is formed in the opposite direction in the first plurality of saturable cores.

6. A device as defined in claim 5, which further comprises a choke coil connected in series with the bias winding.

7. A device for detecting a d.c. current flowing through a conductor, comprising:
   first, second, third and fourth saturable cores each enclosing said conductor;
   first, second, third and fourth output windings wound on the corresponding saturable cores, respectively, each of said output windings including a pair of terminals;
   a feedback winding on each of the saturable cores;
   a first output circuit connected with the first and second output windings and a second output circuit connected with the third and fourth output windings, each output circuit including a load connected across respective ones of said pair of terminals of the two output windings to which each output circuit is coupled, a pair of diodes connected in series in the same direction across the load, and an A.C. supply source connected at its one end to the other terminals of the two output windings and at its other end to a connecting line between the serially connected diodes; and
   an amplifier having an input connected to said output circuits to receive a difference between output signals of the first and second output circuits and having an output connected with said feedback windings to supply an output current from said amplifier to said feedback windings, whereby the magnitude of the feedback current is a function of the magnitude of the d.c. current flowing through the conductor.

8. A device as defined in claim 7, in which a parallel circuit of a diode and a resistor is inserted between the other terminals of the output windings and the A.C. supply source.

9. A device as defined in claim 8, in which the first and third saturable cores are selected to have similar exciting current characteristics while the second and fourth saturable cores are selected to have similar exciting current characteristics.

10. A device as defined in claim 7, which further comprises an impedance element connected to the loads of the first and second output circuits such that two load currents flow therethrough in the opposite direction and means for applying the difference between two load current flows to the amplifier.

11. A device as defined in claim 1, wherein the selection means comprises a first diode means in said first closed current path and a second diode means in said second closed current path, said first and second diode means being connected in said closed current paths to select the greater of said closed current path flows to supply to said load.

12. A device as defined in claim 1, wherein the conductor includes a plurality of windings with at least one winding adjacent each of said saturable cores.

13. A device as defined in claim 1 or 4, wherein the feedback windings are coupled in series.

14. A device as defined in claim 1 or 7, wherein the voltage of the A.C. supply source is set at a level sufficient to make the unsaturation time of the saturable cores greater than the saturation time thereof to eliminate slits in the output voltages of the first and second output circuits.

15. A device as defined in claim 14, wherein the voltage of said A.C. source is equal to or greater than 1.25 times a voltage drop in each of the closed current paths.

* * * * *